(12) United States Patent
Yoshimoto et al.

(10) Patent No.: US 9,029,979 B2
(45) Date of Patent: May 12, 2015

(54) 4H-SIC SEMICONDUCTOR ELEMENT AND SEMICONDUCTOR DEVICE

(71) Applicant: Hitachi, Ltd., Chiyoda-ku, Tokyo (JP)

(72) Inventors: Hiroyuki Yoshimoto, Tokyo (JP); Ryuta Tsuchiya, Tokyo (JP); Naoki Tega, Kunitachi (JP); Digh Hisamoto, Kokubunji (JP); Yasuhiro Shimamoto, Tokorozawa (JP); Yuki Mori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 159 days.

(21) Appl. No.: 13/684,314

(22) Filed: Nov. 23, 2012

(65) Prior Publication Data

US 2013/0146897 A1 Jun. 13, 2013

(30) Foreign Application Priority Data

Nov. 28, 2011 (JP) ................................. 2011-258432

(51) Int. Cl.
| | |
|---|---|
| *H01L 21/70* | (2006.01) |
| *H01L 29/16* | (2006.01) |
| *H01L 21/04* | (2006.01) |
| *H01L 29/417* | (2006.01) |
| *H01L 29/423* | (2006.01) |
| *H01L 29/66* | (2006.01) |
| *H01L 29/78* | (2006.01) |
| *H01L 29/04* | (2006.01) |

(52) U.S. Cl.
CPC ........ *H01L 29/1608* (2013.01); *H01L 21/0475* (2013.01); *H01L 21/049* (2013.01); *H01L 29/41758* (2013.01); *H01L 29/4238* (2013.01); *H01L 29/66068* (2013.01); *H01L 29/7827* (2013.01); *H01L 29/045* (2013.01)

(58) Field of Classification Search
USPC .................. 257/328–341, E33.035, E31.023, 257/E31.046, E31.049, E29.104, E21.605, 257/E21.603, E21.541
See application file for complete search history.

(56) References Cited

U.S. PATENT DOCUMENTS

| | | | | | |
|---|---|---|---|---|---|
| 5,168,331 | A | * | 12/1992 | Yilmaz .......................... | 257/331 |
| 5,506,421 | A | * | 4/1996 | Palmour ......................... | 257/77 |
| 5,736,753 | A | * | 4/1998 | Ohno et al. ..................... | 257/77 |
| 5,747,831 | A | * | 5/1998 | Loose et al. .................... | 257/77 |
| 7,235,857 | B2 | * | 6/2007 | Majumdar et al. ............. | 257/510 |
| 2005/0104131 | A1 | * | 5/2005 | Chidambarrao et al. ..... | 257/369 |
| 2005/0181536 | A1 | | 8/2005 | Tsuji | |

FOREIGN PATENT DOCUMENTS

JP      2005-244180  A      9/2005

* cited by examiner

*Primary Examiner* — Cuong Q Nguyen
*Assistant Examiner* — Nishath Yasmeen
(74) *Attorney, Agent, or Firm* — Miles & Stockbridge P.C.

(57) ABSTRACT

A trench groove is formed and a silicon oxide film is buried in the periphery of a channel region of (0001) surface 4h-SiC semiconductor element. The oxide film in the trench groove is defined in such a planar layout that a tensile strain is applied along the direction of the c-axis and a compressive strain is applied along two or more of axes on a plane perpendicular to the c-axis. For example, trench grooves buried with an oxide film may be configured to such a layout that they are in a trigonal shape surrounding the channel, or are arranged symmetrically with respect to the channel as a center when arranged discretely.

11 Claims, 21 Drawing Sheets

C-AXIS
(0001)

NO STRAIN c-AXIS 10% TENSILE STRAIN c=AXIS 10% COMPRESSIVE STRAIN b=AXIS 10% COMPRESSIVE STRAIN (DASHED LINE : STRAINED, SOLID LINE : NO STRAIN)

b=AXIS 10% COMPRESSIVE STRAIN a,b-AXIS 10% TENSILE STRAIN a,b=AXIS 10% COMPRESSIVE STRAIN a,b=AXIS 10% COMPRESSIVE STRAIN
+ c-AXIS 10% TENSIL STRAIN ( DASHED LINE : STRAINED,
SOLID LINE : NO STRAIN)

4H-SIC SEMICONDUCTOR ELEMENT AND SEMICONDUCTOR DEVICE

CLAIM OF PRIORITY

The present application claims priority from Japanese patent application JP 2011-258432 filed on Nov. 28, 2011, the content of which is hereby incorporated by reference into this application.

FIELD OF THE INVENTION

The present invention concerns a structure of a 4h-SiC semiconductor element and a manufacturing method thereof and it particularly relates to a trench type power MOSFET using 4h-SiC for a semiconductor of the element.

BACKGROUND OF THE INVENTION

Since silicon carbides (SiC) have a larger band gap than silicon and a dielectric breakdown field strength about ten times as large as silicon, silicon carbides have been used in various semiconductor elements including power semiconductors. About 200 types of crystals have been known for SiC around those of 3C-SiC, 4h-SiC, and 6h-SiC. Among them, 4h-SiC has been used generally since a band gap is as large as about 3.2 eV and a substrate can be prepared more easily compared with other structures. As the semiconductor devices, 4h-SiC is mainly used for power diodes and power MOSFETs (Metal Oxide Field Effect Transistors). Among them, SiC power MOSFET has higher switching speed since this is a unipolar device, when compared with Si IGBT, and the substrate can be made thinner since it has higher dielectric breakdown field strength and the resistance during operation referred to as on resistance can be lowered when compared with the Si power MOSFET.

FIG. 2 shows a cross sectional view of a typical power MOSFET. In 4h-SiC, (0001) surface where the c-axis is perpendicular to a substrate allowing easy manufacture of the substrate is used for the surface orientation of substrate. The drain region 2a at the back of the substrate is in contact with a drain electrode 1a at a high concentration of about $10^{18}$ ($cm^{-3}$) in order to lower the contact resistance. Further, the drain region 2a and an n-drift region 3a at a low concentration are prepared from the drain region separately by epitaxial growth. A base region 4a comprises a p-type impurity layer, in which an n-type inversion layer is formed just below a gate oxide film 7a when the gate electrode 6a is turned on and in electric conduction with a source region 5a.

The power MOSFET also includes a trench type as shown in FIG. 3. In the structure, an additional step is necessary for forming a trench compared with the plane type power MOSFET. However, since a channel is formed in a direction perpendicular to the substrate, refinement is easy, and the on resistance can be lowered and the chip area can be decreased by improving the channel density. Further, it does not cause JFET (Junction Field Effect Transistor) resistance due to a depletion layer in the junction between the drift layer 3a and the p-type impurity layer 4a on both sides thereof just below the gate oxide film 7a of FIG. 2. Further, since the electron mobility in 4h-SiC is greatest along the direction parallel to the c-axis, the channel mobility increases and the channel resistance is decreased in the trench type MOSFET having the substrate surface of (0001) surface.

By the way, while the ratio of the channel resistance to the entire on resistance in the SiC power MOSFET decreases as the designed withstanding voltage is higher, this is generally larger when compared with the power MOSFET or Si IGBT. This is because SiC has high a withstanding voltage, the thickness of the drift layer can be reduced to about 1/10 compared with that of the Si element and, since the resistance of the drift layer is low and, on the other hand, the rate of decreasing the channel mobility than the bulk mobility is greater than that in the Si element.

Accordingly, for lowering the on resistance of the SiC power MOSFET, it is necessary to lower the channel resistance.

For the subject, Japanese Patent Unexamined Application Publication No. 2005-244180 describes a method of decreasing the effective mass of carriers by applying a tensile strain in a uniaxial direction to thereby change the band mass and to improve the channel mobility.

SUMMARY OF THE INVENTION

As a method of improving the channel mobility, Japanese Patent Unexamined Application Publication No. 2005-244180 describes only the method of applying strain along a monoaxial direction. However, the channel mobility cannot be improved sufficiently by the method described in Japanese Patent Unexamined Application Publication No. 2005-244180.

The present invention has been achieved in view of the foregoings and it intends to improve the channel mobility of a (0001) surface 4h-SiC semiconductor element.

The present invention provides the following typical feature.

A 4h-SiC semiconductor element having: a first conduction type drift region formed on the surface of a first conduction type 4h-SiC substrate having a c-axis in a direction perpendicular to the surface of the substrate, a second conduction type 4h-SiC base region in contact with the drift region, a first conduction type 4h-SiC source region in contact with the base region, a source electrode formed to the source region, a trench-shaped gate electrode adjacent to the base region and the source region, a gate insulating film formed at a boundary between the gate electrode and the 4h-SiC region, a first conduction type drain region in contact with the back surface of the 4h-SiC substrate, and a drain electrode in contact with the drain region, and a compressive strain is applied along the direction of two or more axes on a plane perpendicular to the c-axis, and a tensile strain is applied along the direction of the c-axis to a channel region by a trench-shaped buried oxide film layer adjacent to the base region and the source region.

The present invention can provide a trench-type 4h-SiC semiconductor device of high channel mobility, and a semiconductor device.

BRIEF DESCRIPTION OF THE DRAWINGS

FIGS. 5A to 5D are graphs showing result of first principles calculation showing a band displacement of a conduction band under application of various strains on 4h-SiC, in which FIG. 5A is a graph with no application of strain;

FIG. 5B is a graph with application of c-axis 10% tensile strain;

FIG. 5C is a graph with application of c-axis 10% compressive strain;

FIG. 5D is a graph with application of b-axis 10% compressive strain;

FIGS. 6E to 6H are graphs showing result of first principles calculation showing band displacement of a conduction band under application of various strains on 4h-SiC, in which FIG. 6E is a graph with application of b-axis 10% compressive strain;

FIG. 6F is a graph with application of a-, b-axes 10% tensile strain,

FIG. 6G is a graph with application of a-, b-axes 10% compressive strain, and

FIG. 6H is a graph with application of a-, b-axes 10% compressive strain+c-axis 10% tensile strain;

DETAILED DESCRIPTION OF THE PREFERRED EMBODIMENTS

At first, description is to be made to the result of detailed analysis obtained according to the first principles calculation on the displacement of a band and the displacement of a band mass when strain is applied to 4h-SiC.

Figure 4:
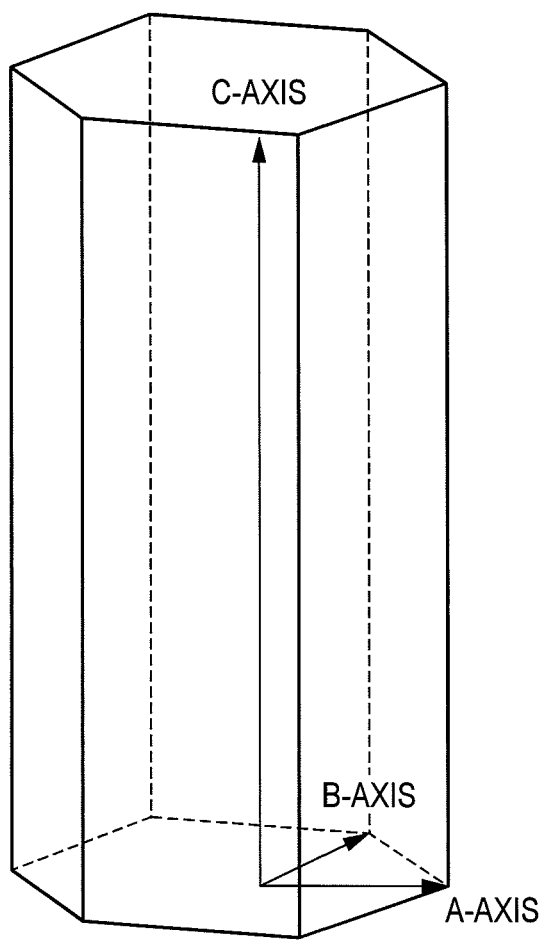
FIG. 4 is a schematic view for explaining the crystal orientation of 4h-SiC.

4h-SiC has a crystal structure having 6-hold symmetry with the c-axis as an axis of symmetry. As shown in FIG. 4, the unit lattice of 4h-SiC is represented by a fundamental translation parallel vector comprising a c-axis, an a-axis on a (0001) surface perpendicular to the c-axis, and a b-axis at an angle of 60° relative to the a-axis.

FIG. 5 and FIG. 6 show the band displacement of a conduction band when various strains are applied to 4h-SiC obtained by band calculation according to the first principles. Among them, FIG. 5A is a band diagram with no application of strain. Since SiC is an indirect transition type semiconductor, the upper end of the valence electron band is positioned around the Γ point as a center, whereas the lower end of the conduction band is positioned at the point M. The dependence of the band energy E(k) of the conduction band on wave number k is approximately represented by the formula (1).

Formula (1)

$$E(k) = \alpha(k-k_0)^2 + \Delta E \quad \text{Formula (1)}$$

In the formula (1), $k_0$ represents a wave number at the point M and ΔE represents the energy at the lower end of a conductor. Further, α represents a parameter showing the slope of a band curve. The effective mass m in this case is represented by the formula (2).

Formula (2)

$$m = \hbar^2 (\partial^2 E(k)/\partial k^2)^{-1} = \hbar^2/(2\alpha)$$  Formula (2)

$h^2$—value obtained by diving a plank's constant with $2\pi$.

As shown in the formula (2), the band mass is smaller as the value α is larger. Accordingly, the band mass is smaller as the slope of the band curve is greater.

Figure 5A:
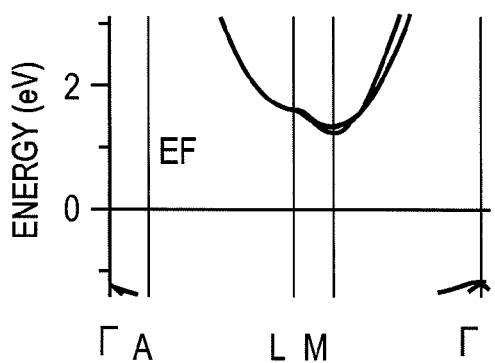

Each of graphs in FIGS. 5A to 5D and FIGS. 6E to 6H shows a band diagram FIG. 5A represented by a solid line in overlap with each band diagram at the lower end of a conduction band with application of a strain represented by a dotted line. In the graphs, strain of causing 10% displacement to the 4h-SiC crystal lattice is applied.

Figure 5B:
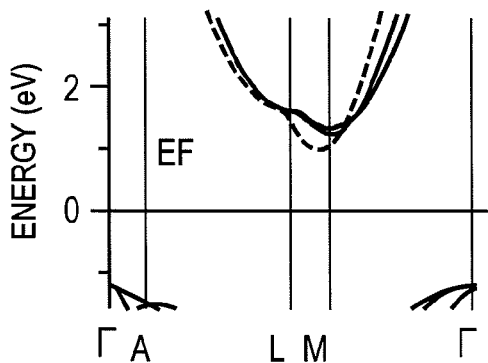
Figure 5C:
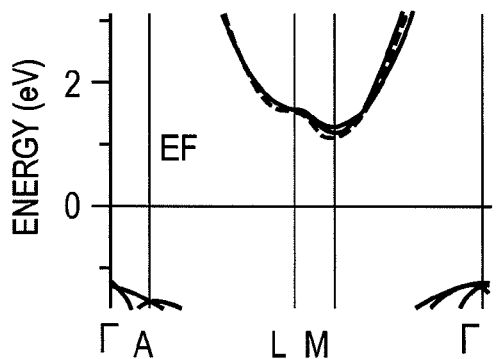

At first, FIG. 5B and FIG. 5C show band displacement under application of strain along the direction of the c-axis. As shown in FIG. 5B, when a tensile strain along the direction of the c-axis is applied, the slope of the band curve increases at the lower end of the point M and the band mass is decreased. This agrees with the result of the Japanese Patent Unexamined Application Publication No. 2005-244180.

Figure 5D:
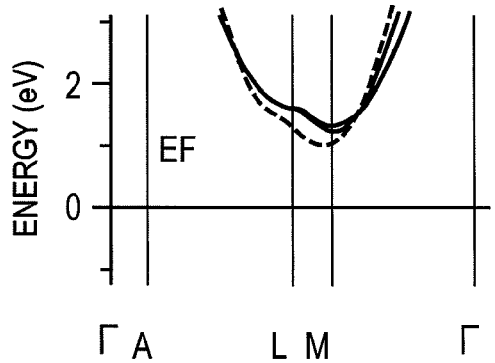
Figure 6E:
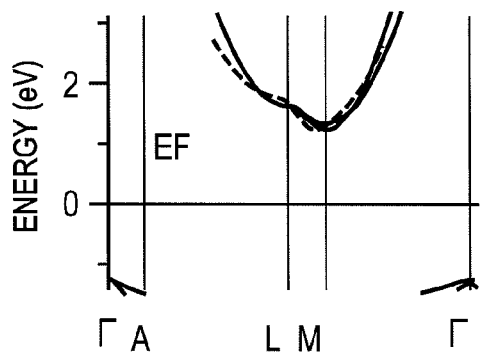
Figure 6F:
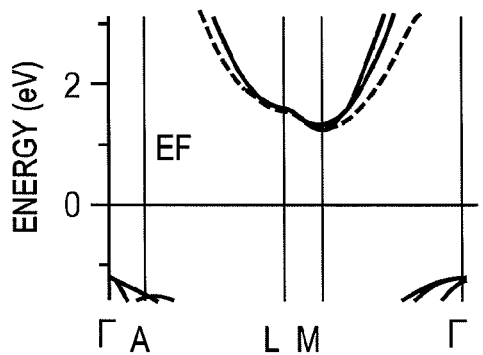
Figure 6G:
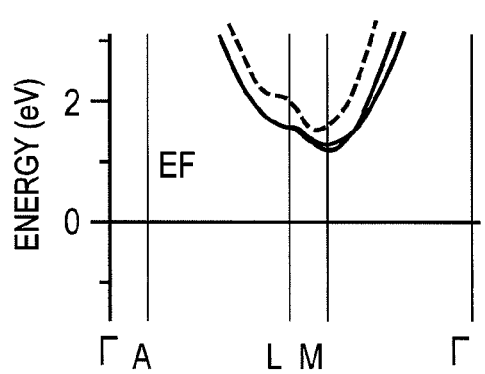
Figure 6H:
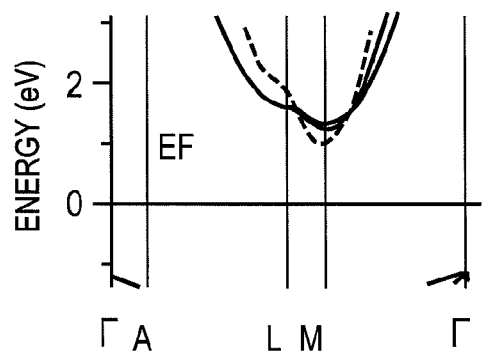

Then, FIG. 5D and FIG. 6E show the band displacement when strain is applied only along the direction of the b-axis. In this case, there is no large displacement for the slope of the band curve. Then, FIG. 6F and FIG. 6G show band displacement when strains uniformly displacing the crystal lattice along the directions of axes a and b, that is, isostatic strain relative are applied to a plane perpendicular to the c-axis. In this case, as shown in FIG. 6G, the slope of the band curve increase due to isostatic compression along the direction of the a- and b-axes. The results described above show that the band mass of the conduction band is decreased when the tensile strain is applied along the direction of the c-axis and isostatic compressive strains are applied along the directions of a- and b-axes. FIG. 6H shows the band displacement when isostatic compressive strains are applied along the direction of the a- and b-axes simultaneously with application of a tensile strain along the direction of the c-axis. As shown in FIG. 6H, the slope of the band curve is largest in this case. The results show that application of the compressive strain isostatically along the directions of a-, b-axes simultaneously with application of a tensile strain along the direction of the c-axis is most effective for increasing the mobility. The structure of element to which such strains is applied is to be described by way of the following preferred embodiments.

First Embodiment

Figure 1:
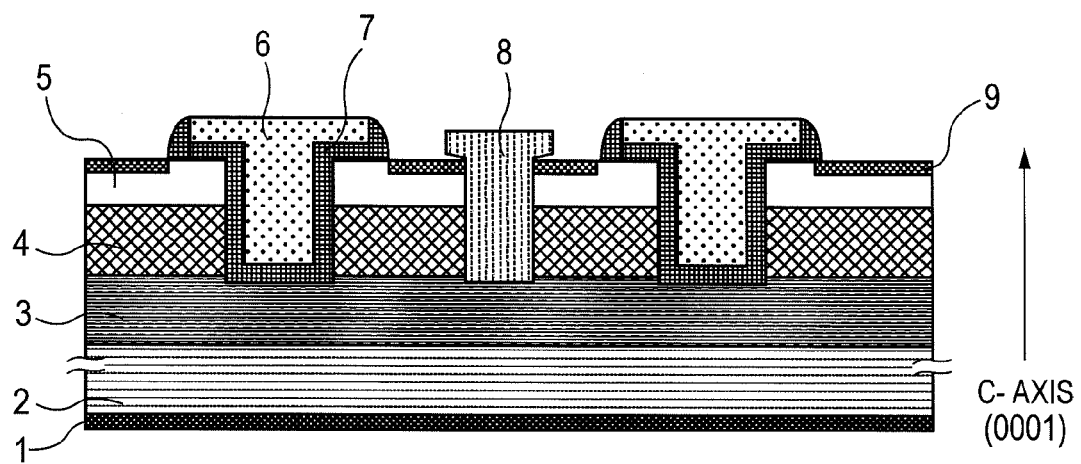
FIG. 1 is a cross sectional view for a main portion of a 4h-SiC semiconductor element according to first, second, third, fourth, and fifth embodiments.
Figure 2:
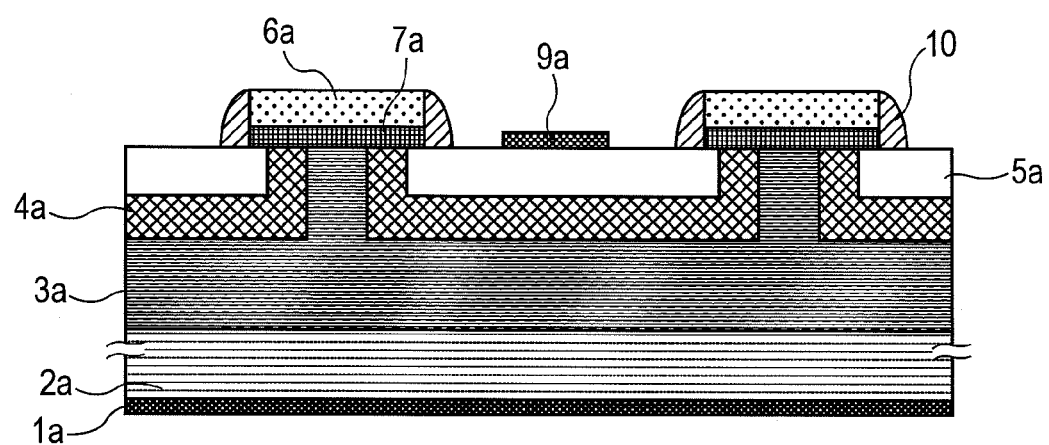
FIG. 2 is a cross sectional view for a main portion of an SiC power MOSFET having a planar type transistor structure.
Figure 3:
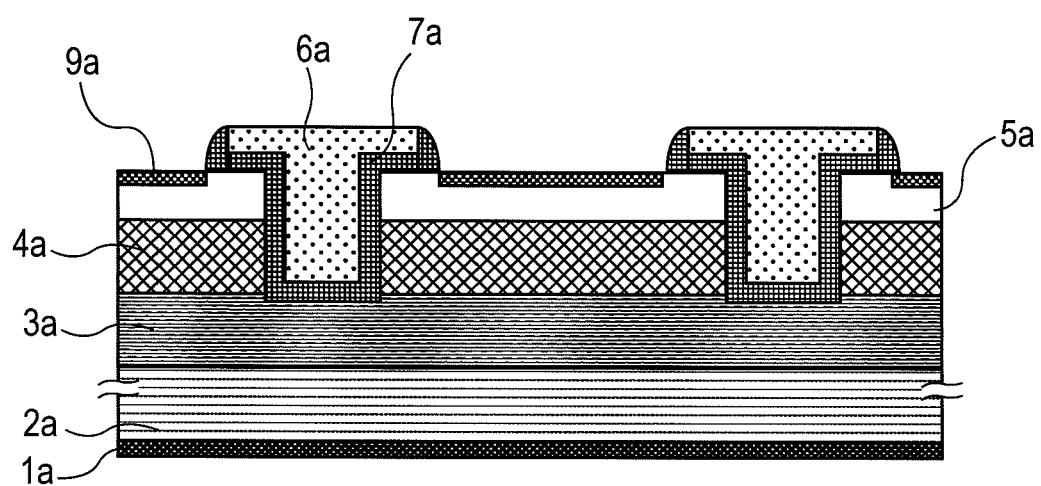
FIG. 3 is a cross sectional view for a main portion of an SiC power MOSFET having a trench type transistor structure.

FIG. 1 is a conceptional view showing a cross sectional structure of a 4h-SiC trench type power MOSFET according to a first embodiment. In FIG. 1, the 4h-SiC trench type power MOSFET according this embodiment comprises a drain electrode 1, a drain region 2, a drift region 3, a base region 4, a source region 5, a gate electrode 6, a gate insulating film. 7, a buried oxide film layer 8, and a source electrode 9.

In the drain electrode 1, a (0001) surface perpendicular to the c-axis is exposed, a silicide is formed and a metal layer is formed by Al sputtering for lowering a contact resistance.

The drain region 2 is an n-type 4h-SiC substrate implanted, for example, with n-type impurities (for example, n: nitrogen or p: phosphorus) to the surface in contact with the drain electrode surface in order to lower the contact resistance.

The drift region 3 is an n-type semiconductor region in which an 4h-SiC having the same orientation as the drain region formed over the drain region 2 by epitaxial growth.

The base region 4 is a p-type semiconductor region positioned over the drift region 3 and formed by implanting p-type impurities (for example, Al: aluminum or B: boron) to 4h-SiC for forming the n-type channel region of a transistor.

The source region 5 is an n-type semiconductor region formed by implanting n-type impurities (for example, n: nitrogen, p: phosphorus) over the base region.

The gate electrode 6 is an electrode region prepared by forming a trench parallel to the c-axis in the base region 4 and the source region 5 described above, for example, by dry etching, forming a gate insulating film, then forming polysilicon by CVD (Chemical Vapor Deposition) or forming amorphous silicon by CVD and then modifying the same into polysilicon by heat treatment.

The gate insulating film 7 is formed at a position put between the trench-shaped gate electrode 6, and the base region 4 and the source region 5 of the 4h-SiC described above, by wet oxidation, dry oxidation or CVD of $SiO_2$ oxide film after trench formation upon fabrication of the gate electrode.

The buried oxide film layer 8 is positioned between the gate electrodes and formed by depositing polysilicon or amorphous silicon by CVD after the same trench etching as the gate electrode, and then modifying the same by thermal oxidation into an oxide film or directly depositing $SiO_2$ by CVD.

The source electrode 9 is formed by silicidation or metal sputtering over the source region 5 thereby lowering the contact resistance with SiC.

Figure 7:
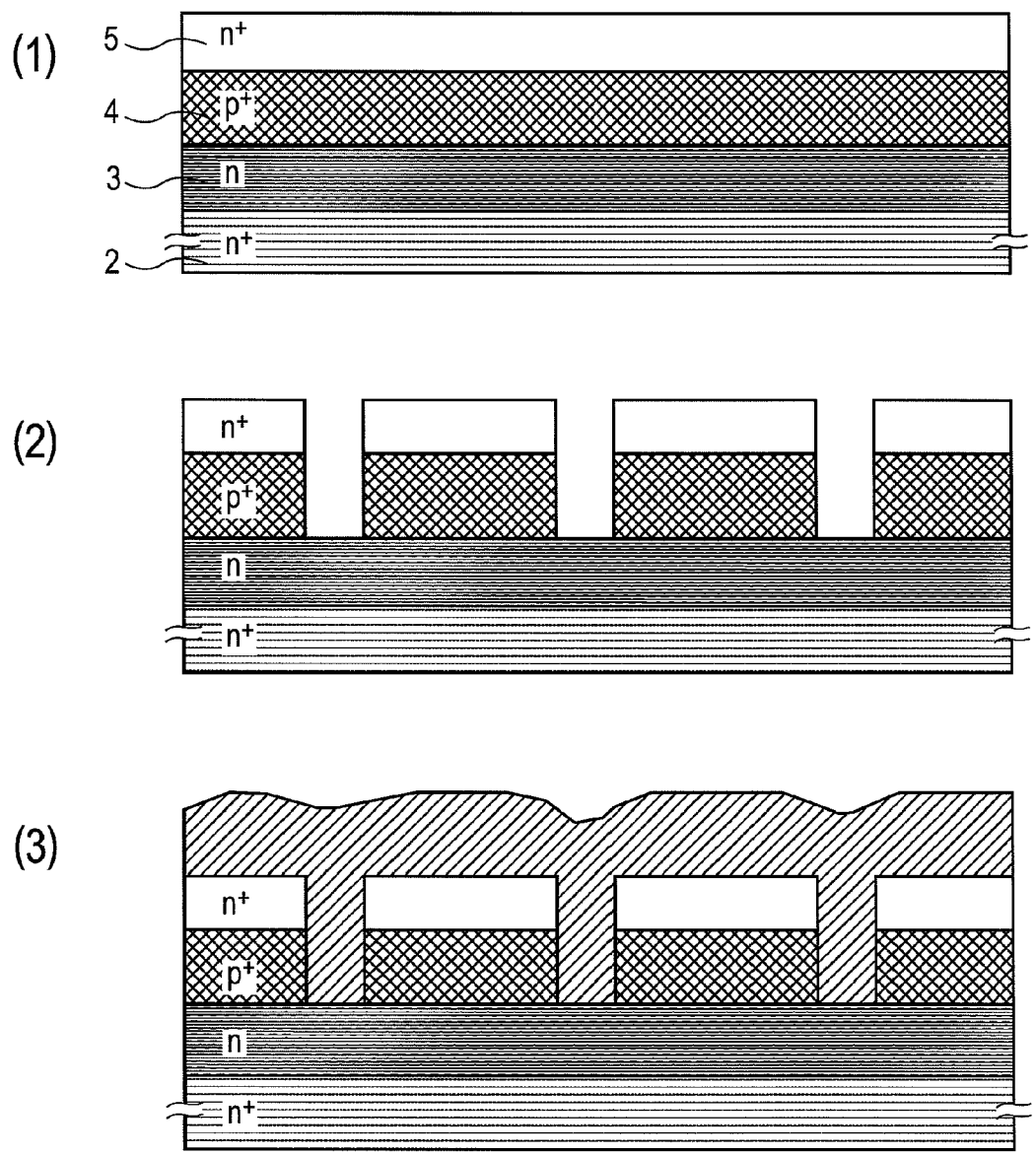
FIG. 7(1), FIG. 7(2), and FIG. 7(3) are cross sectional views for a main portion showing an example of a process flow forming a buried oxide film layer of a 4h-SiC semiconductor device.
Figure 8:
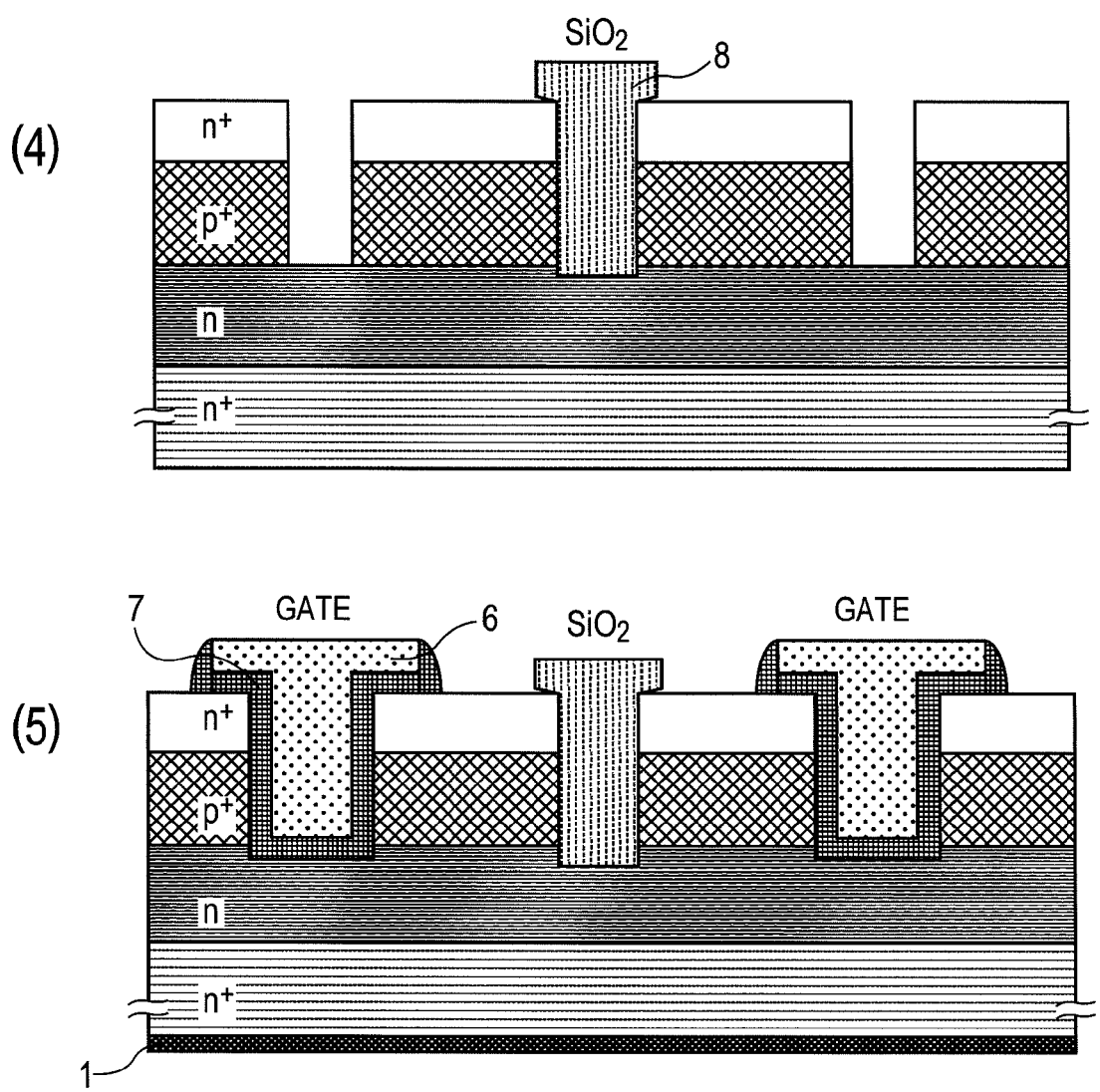
FIGS. 8(4) and FIG. 8(5) are cross sectional views for a main portion showing an example of a process flow forming an buried oxide film layer of a 4h-SiC semiconductor device.

FIG. 7 and FIG. 8 show an example of a process flow upon forming a buried oxide film layer of the 4h-SiC trench type MOSFET of the invention described above. As shown in FIG. 7(1), a p-type base region 4 and an n-type base region 5 are formed by implantation of impurities over an n-type drift layer 3 formed by epitaxial growing over the 4h-SiC substrate.

As shown in FIG. 7(2), the source region 5 and the base region 4 are fabricated to form trenches by a method such as dry etching. In this step, trench etching for the gate electrode or the trench etching for the buried oxide film are conducted simultaneously or separately.

Then, as shown in FIG. 7(3), holes of the trenches are filled by a method, for example, of CVD of polysilicon or amorphous silicon.

Further, as shown in FIG. 8(4), after modifying the deposited silicon layer into $SiO_2$ by thermal oxidation at a temperature about from 700° C. to 1,000° C., those portions other than the buried oxide film layer 8 are removed by dry etching or combination of dry etching and wet etching. During the oxidation, since the crystal lattice spacing of Si is about 0.5 nm and the average lattice spacing of SiC is also about <5 nm, the volume expands due to compositional change from Si to $SiO_2$ by so much as the addition of oxygen atoms. Due to the volumic expansion, strain is applied to the base region 4 and the source region 5 of 4h-SiC.

When forming the buried oxide film layer in FIG. 7(3) and FIG. 8(4), an oxide film may be deposited directly by CVD, etc. and then the gate electrode portion may be removed by etching. In this case, the amorphatized buried oxide film layer 8 expands due to the partial compositional change by a thermal load at about 700° C. to 1,000° C. in usual subsequent process in which strain is applied to the base region 4 and the source region 5 of 4h-SiC.

Figure 9:
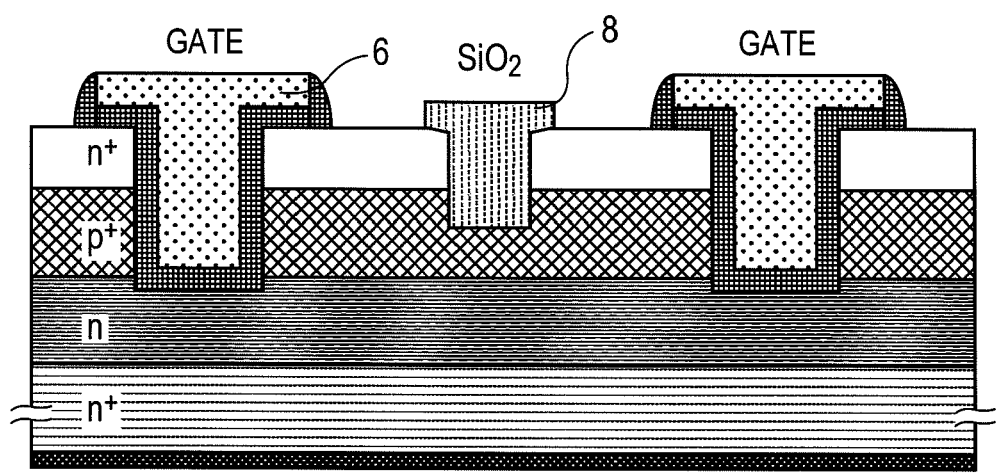
FIG. 9 is a cross sectional view for a main portion showing an example of a 4h-SiC semiconductor device in which a buried oxide film layer is at a depth shallower than that of a trench type gate electrode.
Figure 10:
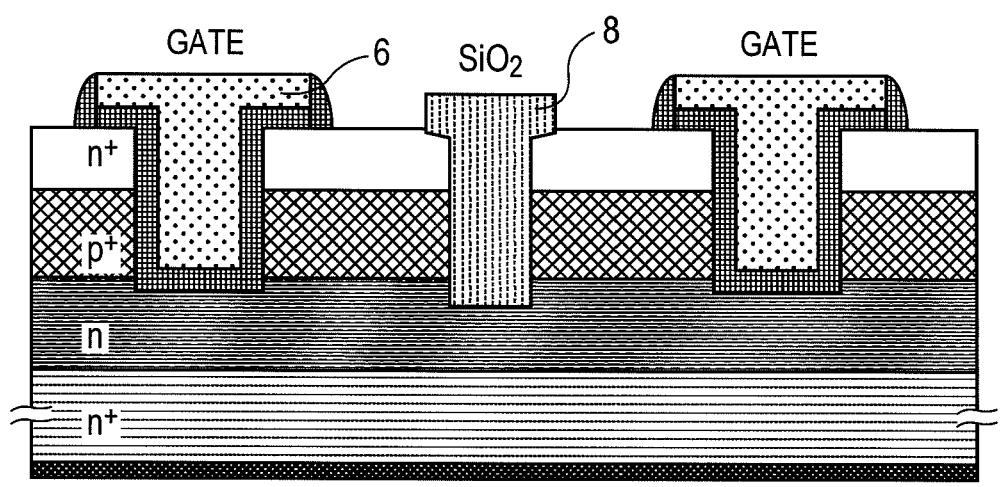
FIG. 10 is a cross sectional view for a main portion showing an example of a 4h-SiC semiconductor element in which a buried oxide film is at a depth deeper than that of the trench type gate electrode.

For the depth of the buried oxide film 8, when it is formed to the same depth as the gate electrode 6, both of them can be prepared in one identical step. When the oxide film layer 8 is formed in a separate step, it may be shallower than the gate electrode 6 as shown in FIG. 9. This can shorten the trench forming time for the buried oxide film layer 8 to decrease the time and the cost necessary for manufacture. Further, as shown in FIG. 10, it may be deeper than the gate electrode as shown in FIG. 10. Then, the region where the strain is applied to improve the electron mobility includes not only the source region and the base region where the channel is formed by the application of a gate voltage but also includes the drift layer region, so that the on resistance can be lowered further.

After the step of FIG. 8(4), the gate insulating film 7, the gate electrode 6, a protecting film, etc. are formed by the process described above thereby forming a trench type power MOSFET.

Second Embodiment

Figure 11:
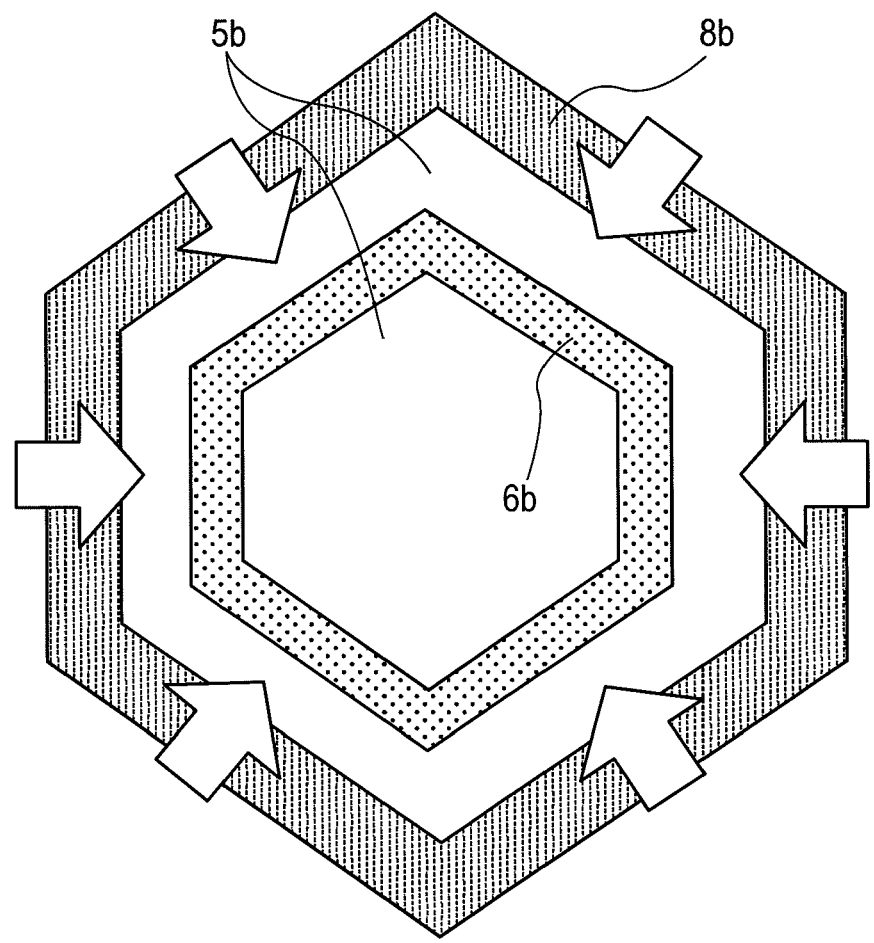
FIG. 11 is a conceptual view for explaining a state of applying an isostatic compressive strain to an 4h-SiC semiconductor element according to the first embodiment.
Figure 12:
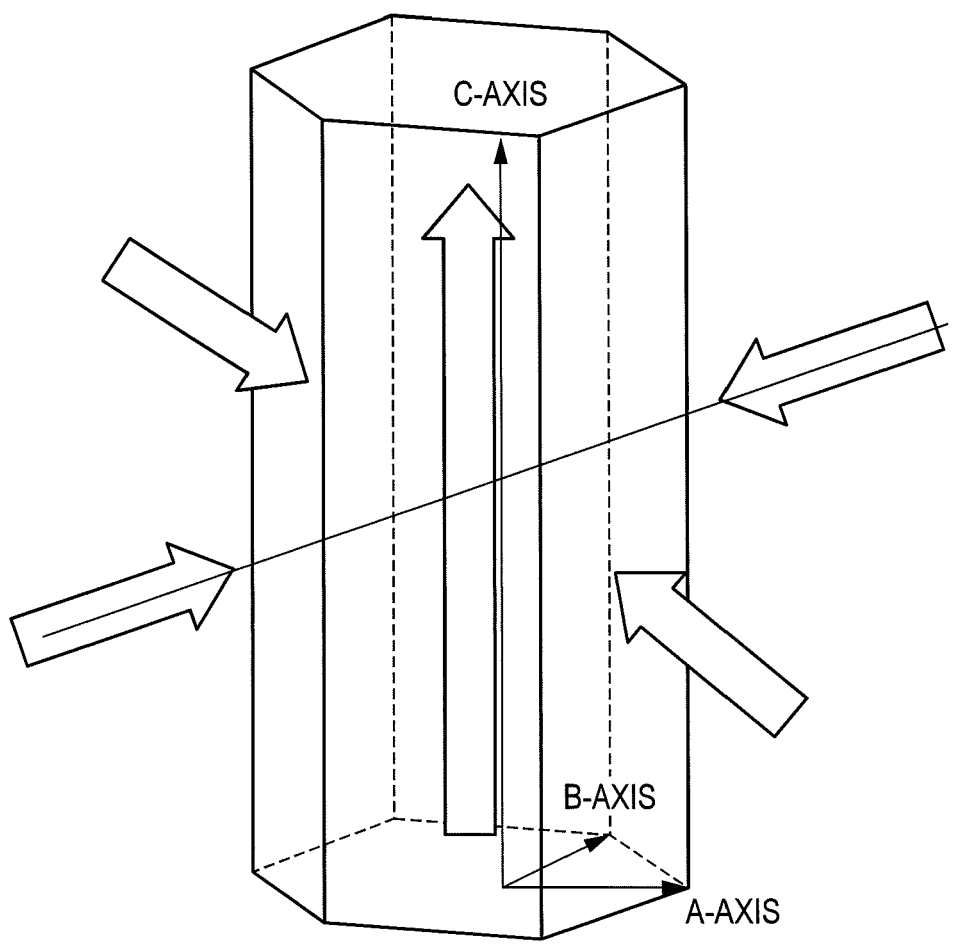
FIG. 12 is a conceptual view for explaining a state of applying a tensile strain along the direction of a c-axis simultaneously with application of isostatic compressive strains along the direction of a-, b-axes to 4h-SiC semiconductor element according to a first embodiment.

In a second embodiment, an isostatic compressive strain is applied on the channel region by a buried oxide film layer having a hexagonal unit structure. FIG. 11 shows a conceptional view of the second embodiment as viewed on the side of the source electrode. In FIG. 11 are shown, a source region 5b, a gate electrode 6b, and a buried oxide film layer 8b. In the second embodiment, the gate electrode 6b and the buried oxide film layer 8b have each a hollow hexagonal structure, in which the buried oxide film layer 8b applies a compressive strain along the direction perpendicular to the c-axis of the source region 5b as shown by arrows described in FIG. 12 and, at the same time, applies a tensile strain along the direction of the c-axis. Specifically, since the Young's modulus of $SiO_2$ is about 130 GPa, and the Young's modulus of SiC is about 430 GPa, 4h-SiC is also compressed isostatically by about 30% of the compression ratio that SiC undergoes by being surrounded with the buried oxide film layer 8. Further, since the Poison ratio of the SiC is about 0.14 to 0.17, the crystal constant along the direction of the c-axis increases by about 14 to 17% of the compression ratio of the crystal lattice along the directions of a- and b-axes.

Figure 13:
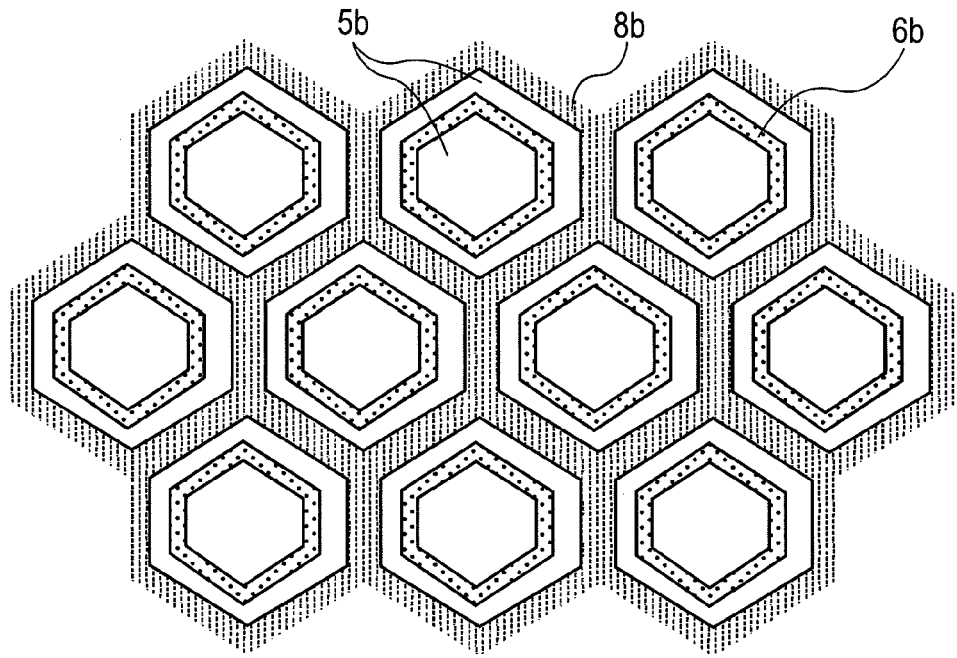
FIG. 13 shows an example of a cross sectional view for a main portion as viewed on the side of a source region over (0001) surface of a 4h-SiC semiconductor element of the first embodiment.
Figure 14:
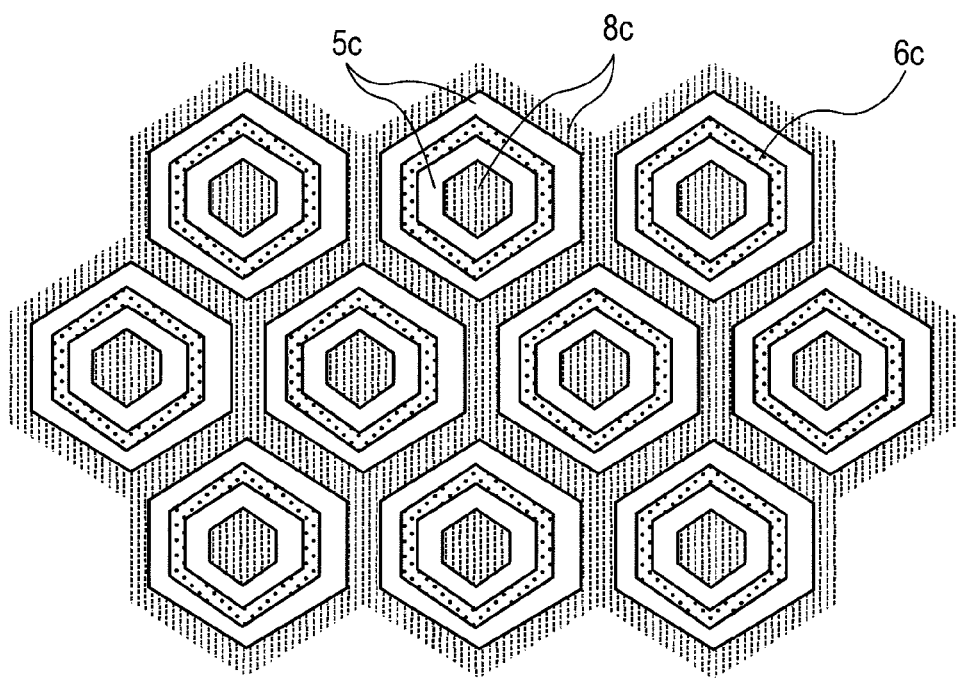
FIG. 14 shows another example of a cross sectional view for a main portion as viewed on the side of a source region over (0001) surface of a 4h-SiC semiconductor element of the first embodiment.
Figure 15:
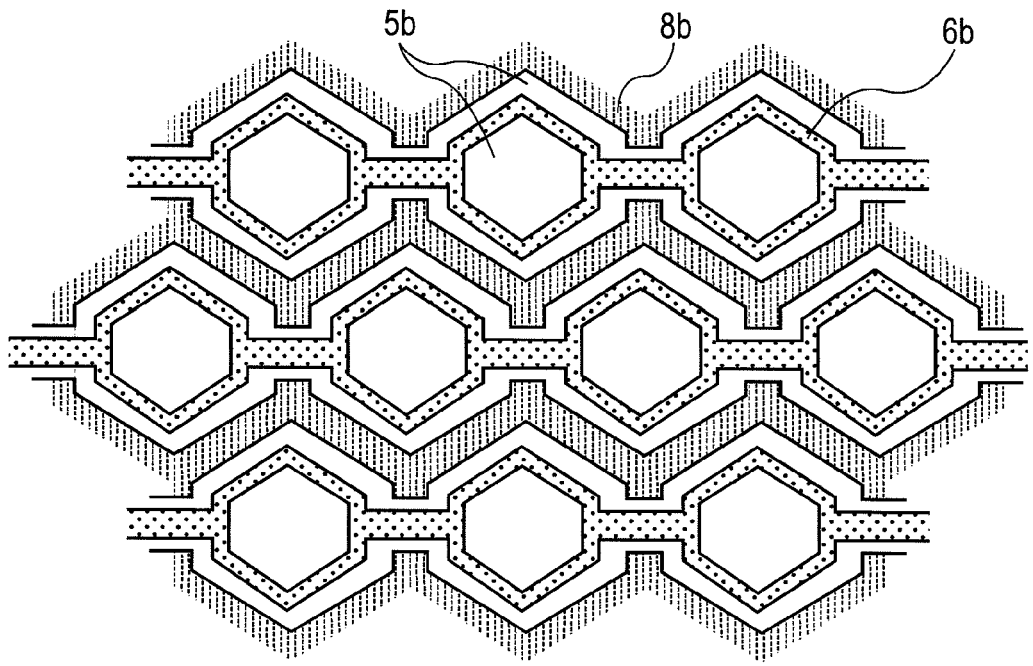
FIG. 15 shows a further example of a cross sectional view for a main portion as viewed on the side of a source region over (0001) surface of a 4h-SiC semiconductor element of the first embodiment.
Figure 16:
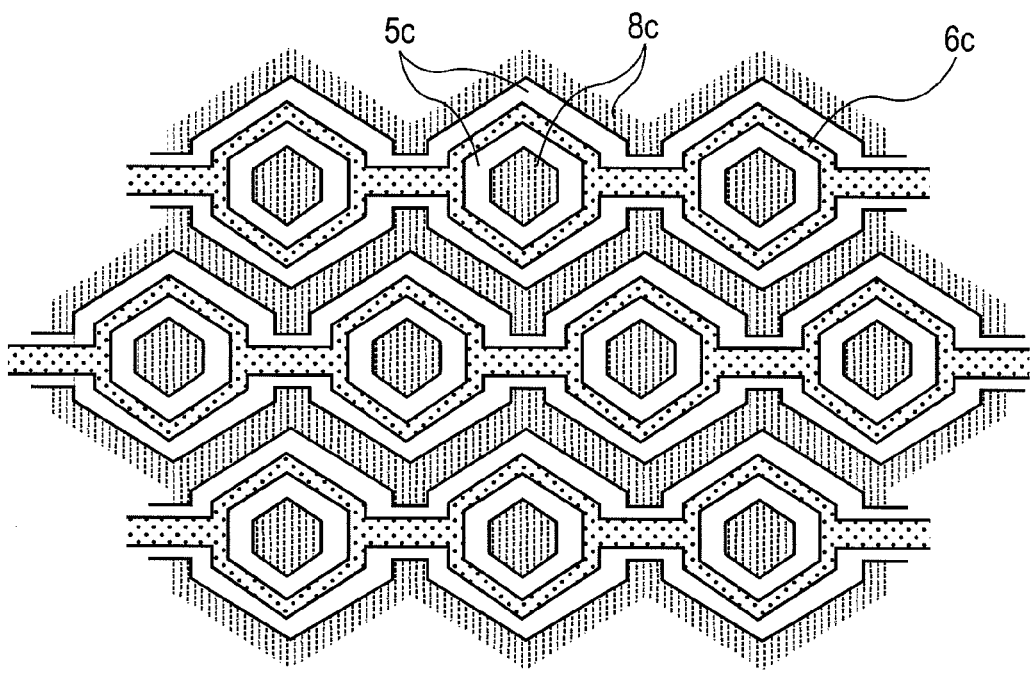
FIG. 16 shows a further example of a cross sectional view for a main portion as viewed on the side of a source region over (0001) surface of a 4h-SiC semiconductor element of the first embodiment.
Figure 17B:
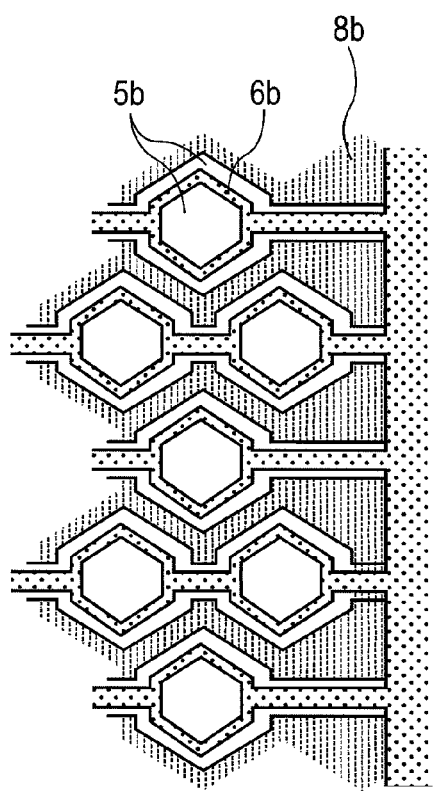
FIG. 17B is a fragmentary enlarged view thereof.
Figure 17A:
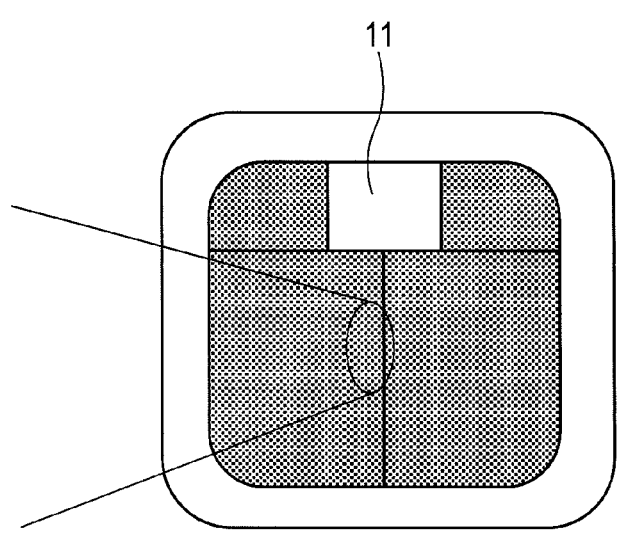
FIG. 17A is a view on the side of a source region over (0001) surface of a 4h-SiC semiconductor element of the first embodiment.

FIG. 13 shows an example of arrangement of semiconductor elements in FIG. 11 in a semiconductor device. Since the unit structure of the element is hexagonal, they can be arranged with no gaps due to the displacement of the arrangement as shown in FIG. 13. In FIG. 11 and FIG. 13, while only the source region 5b is provided inside the gate electrode 6b, a buried oxide film layer 5b may be provided further so as to apply compressive strain to the channel region from the inside and the outside of the hexagonal shape. This weakens the isotropicity of the strain, the compressive strain itself can be applied more efficiently. In FIG. 13 and FIG. 14, the gate electrodes 6b in the inside of the respective hexagonal shapes are isolated from each other. Respective gate electrodes are electrically conducted, for example, by providing an interconnect layer thereover in the subsequent manufacturing step, so that a voltage can be applied by a gate electrode pad at one position. On the contrary, as shown in FIG. 15 and FIG. 16, each of the gate electrodes 6b may be connected directly without providing the interconnect layer thereover, so that the voltage may be applied at one position of the gate electrode pad 11 as shown in FIGS. 17A and 17B. Thus, although the strain isotropicity is weakened, the manufacturing cost can be decreased by removing one layer of the interconnect layer. For the connection method of the gate electrodes 6b between each of the hexagonal unit structures, the unit structure may not be connected on every column in one direction as in FIG. 15 and FIG. 16 but may be connected to other columns or gate electrodes of elements in a different direction.

Third Embodiment

Figure 18:
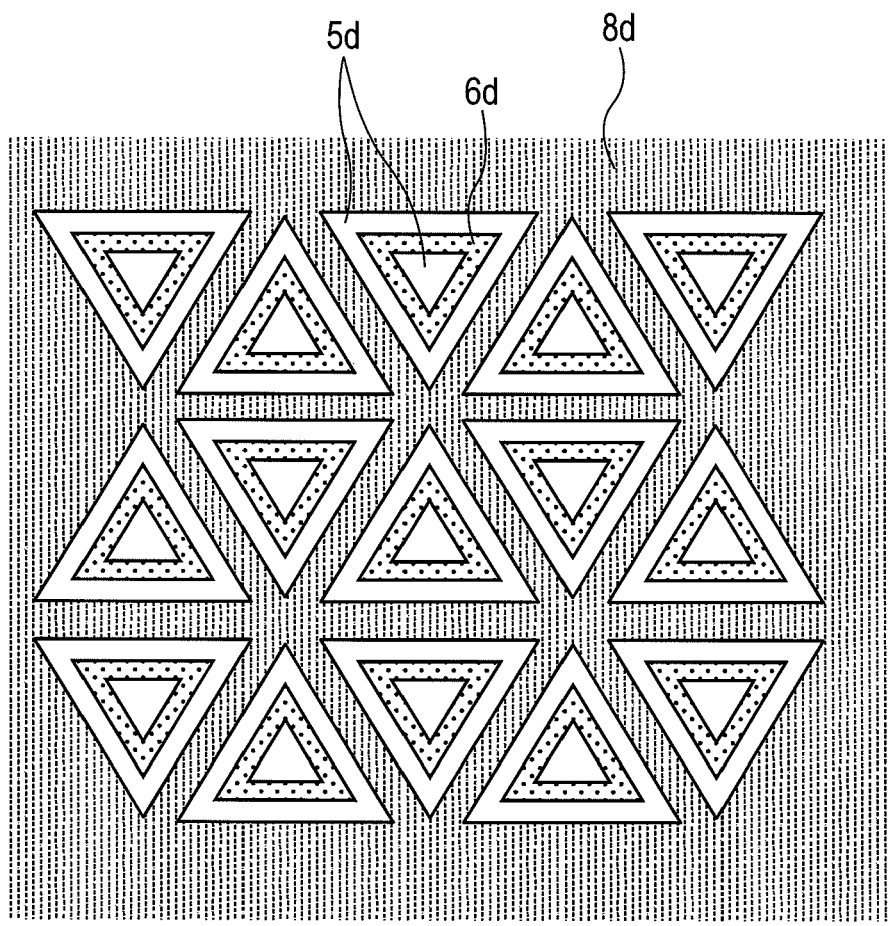
FIG. 18 shows an example of a cross sectional view for a main portion as viewed on the side of a source region over (0001) surface of a 4h-SiC semiconductor element of a second embodiment.
Figure 19:
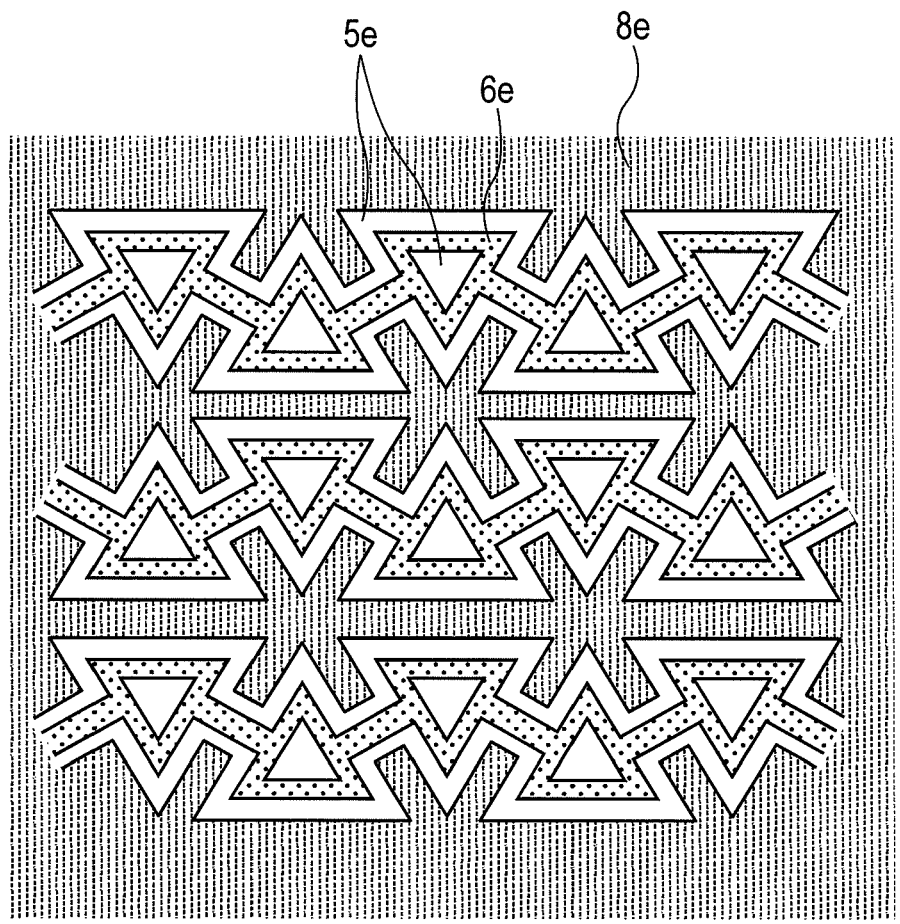
FIG. 19 shows another example of a cross sectional view for a main portion as viewed on the side of a source region over (0001) surface of a 4h-SiC semiconductor element of the second embodiment.

In the third embodiment, different from the second embodiment, a gate electrode 6b and a buried oxide film layer 8d have each a hollow trigonal unit structure. In the third embodiment, isostatic compressive strain is applied to the channel region by a buried oxide film layer having the trigonal unit structure. In the third embodiment, since the ratio of the area for the buried oxide film layer to the area for the source region can be made greater compared with that in the second embodiment, a larger compressive strain can be applied. The trigonal shape is preferably closer to a normal triangle shape so as to apply more isostatic strain. In FIG. 18, the buried oxide film 8d is not present inside the trigonal shape, but the buried oxide film 8d may be provided inside the gate electrode. In FIG. 18, the gate electrodes 6b in the inside of the respective trigonal shapes are isolated from each other. All of the respective gate electrodes are electrically conducted, for example, by providing a metal layer thereover in the subsequent manufacturing step, so that a voltage can be applied by a gate electrode pad at one position. On the contrary, as shown in FIG. 19, for example, each of the gate electrodes 6b may be connected directly without providing the interconnect layer thereover, so that a voltage may be applied by a gate electrode pad 11 at one position by the method as shown in FIGS. 17A and 17B of the second embodiment. For the connection method of the gate electrodes 6e between each of the trigonal unit structures, the unit structure may not be connected on every column in one direction as in FIG. 19 but maybe connected to other columns or gate electrodes of elements in a different direction.

Fourth Embodiment

Figure 20:
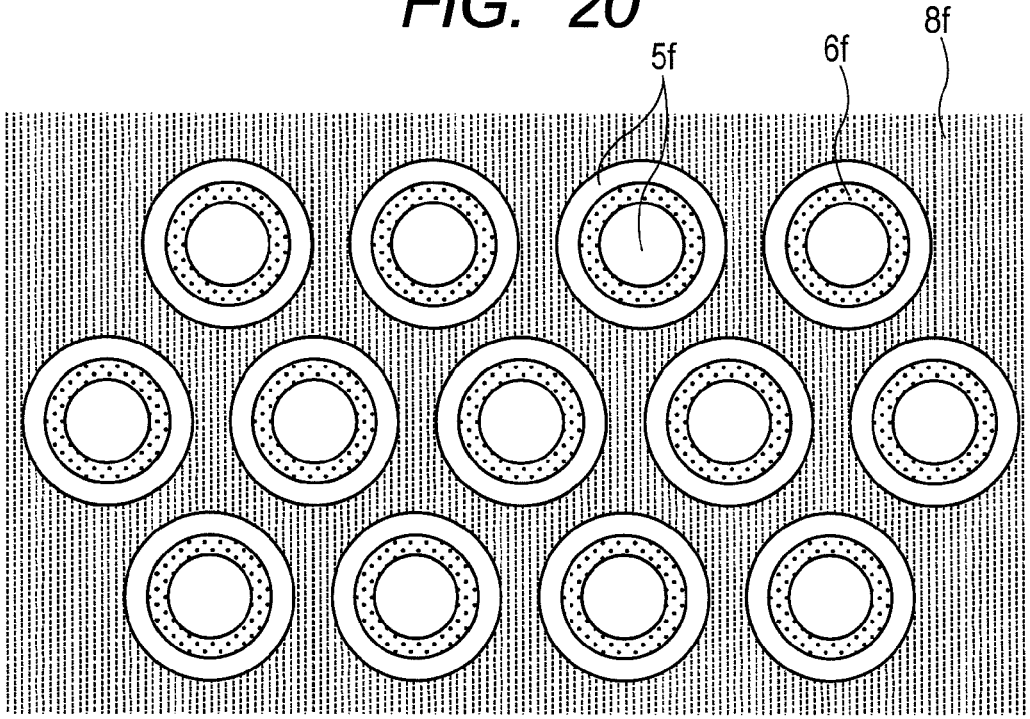
FIG. 20 shows an example of a cross sectional view for a main portion as viewed on the side of a source region over (0001) surface of a 4h-SiC semiconductor element of a third embodiment.
Figure 21:
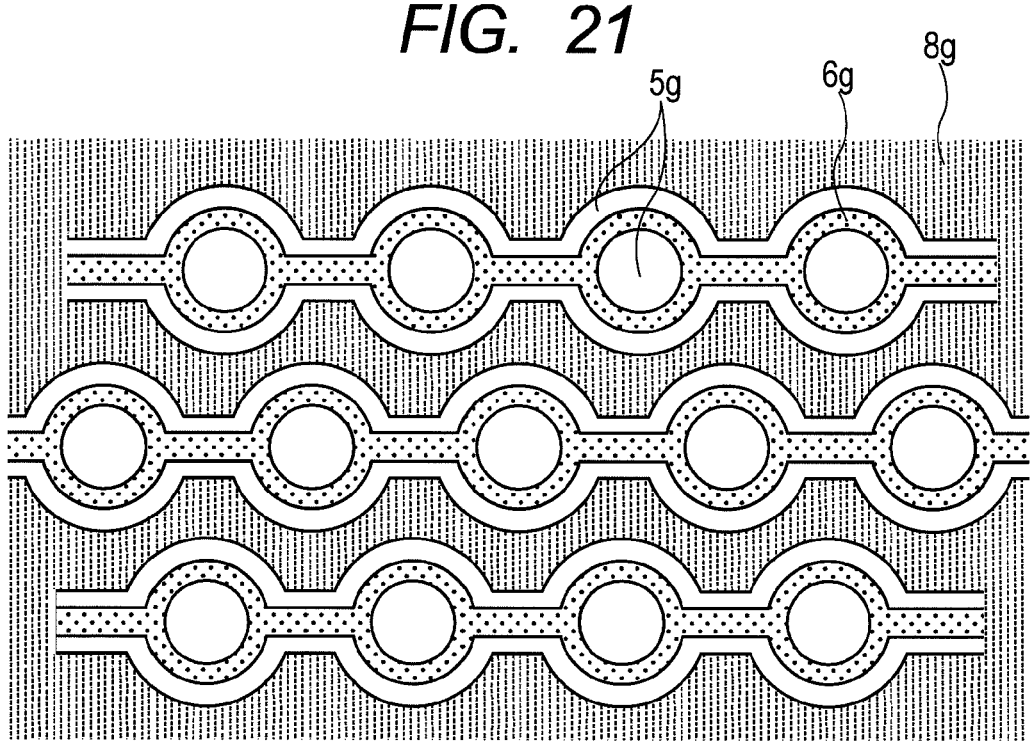
FIG. 21 shows another example of a cross sectional view for a main portion as viewed on the side of a source region over (0001) surface of a 4h-SiC semiconductor element of the third embodiment.

In a fourth embodiment, different from the second and third embodiments, a gate electrode 6f and a buried oxide film layer 8f each have a hollow circular unit structure. In the fourth embodiment, the buried oxide film layer 8f having the circular unit structure applies an isostatic compressive strain on a channel region. In the fourth embodiment, the compressive strain can be applied more isostatically and the electron mobility can be improved more compared with the second and third embodiments. In FIG. 20, the buried oxide film layer 8f is not present but the buried oxide film layer 8f may be provided inside the gate electrode. In FIG. 20, the gate electrodes 6f inside the respective circular shapes are isolated from each other. All of respective gate electrodes are electrically conducted, for example, by providing a metal layer thereover in the subsequent manufacturing step, so that a voltage can be applied by a gate electrode pad at one position. On the contrary, as shown in FIG. 21, each of the gate electrodes 6g may be connected directly without providing the interconnect layer thereover, so that the voltage may be applied by the gate electrode pad 11 at one position by the method as shown in Figs. 17A and 17B of the second embodiment. For the connection method of the gate electrodes between each of the circular unit structures, the unit structure may not be connected on every column in one direction as in FIG. 21 but may also be connected to other columns or gate electrodes of elements in a different direction.

Fifth Embodiment

Figure 22:
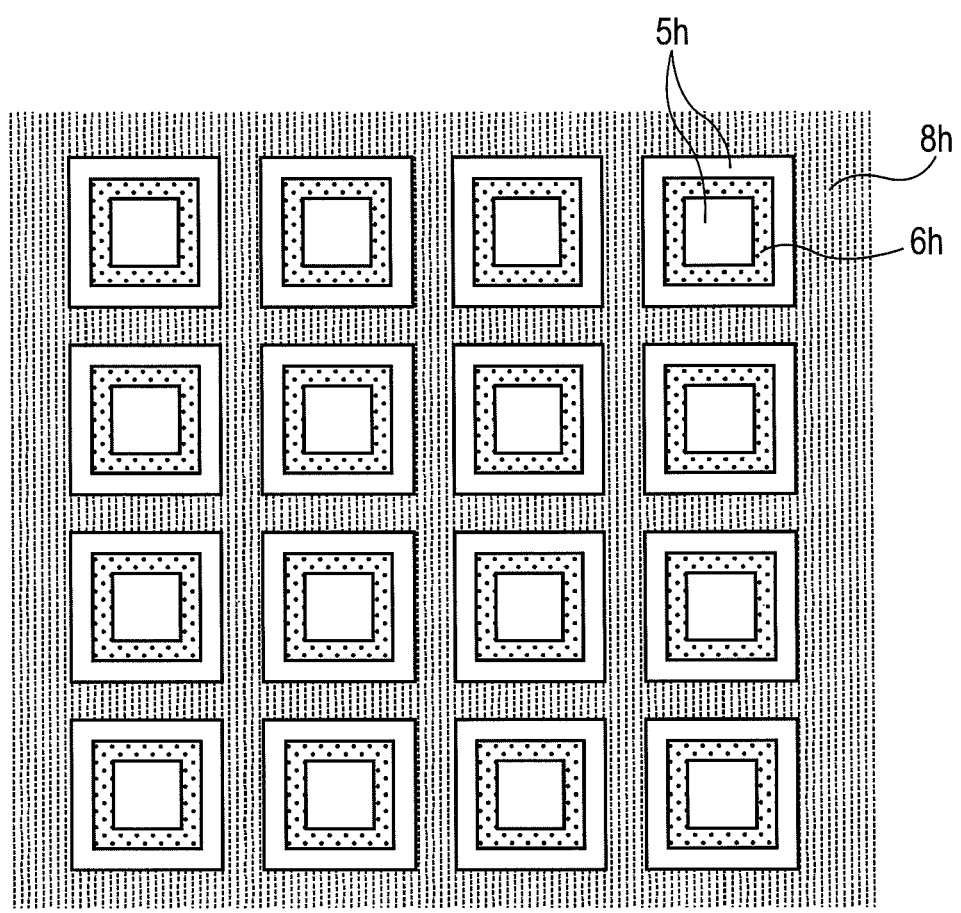
FIG. 22 shows an example of a cross sectional view for a main portion as viewed on the side of a source region over (0001) surface of a 4h-SiC semiconductor element of a fourth embodiment.
Figure 23:
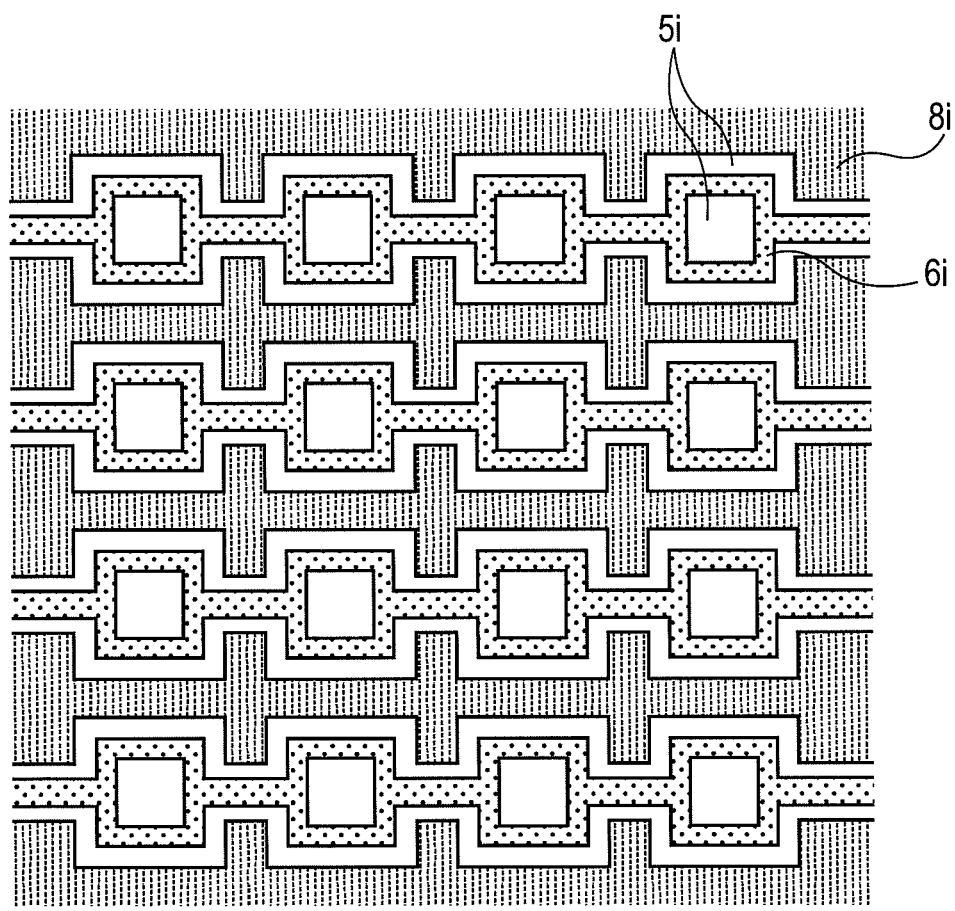
FIG. 23 shows another example of a cross sectional view for a main portion as viewed on the side of a source region over (0001) surface of a 4h-SiC semiconductor element of the fourth embodiment.
Figure 24:
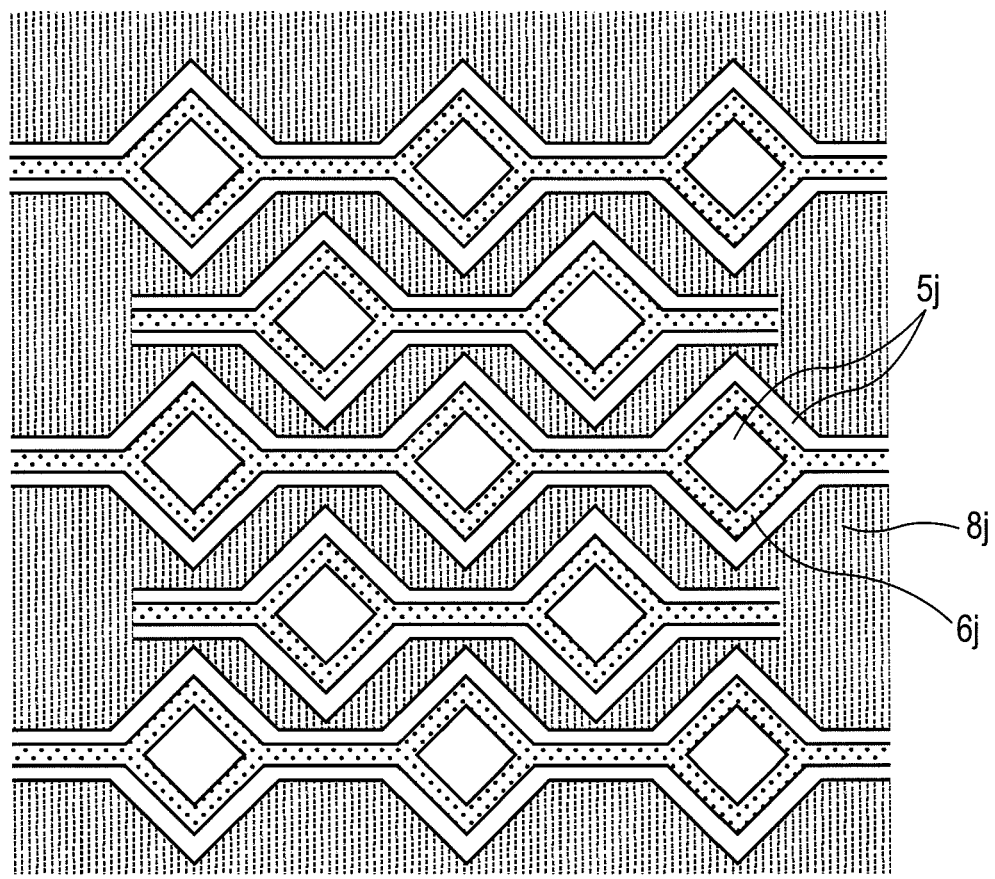
FIG. 24 is another example of a cross sectional view for a main portion as viewed on the side of a source region over (0001) surface of a 4h-SiC semiconductor element of the fourth embodiment.
Figure 25:
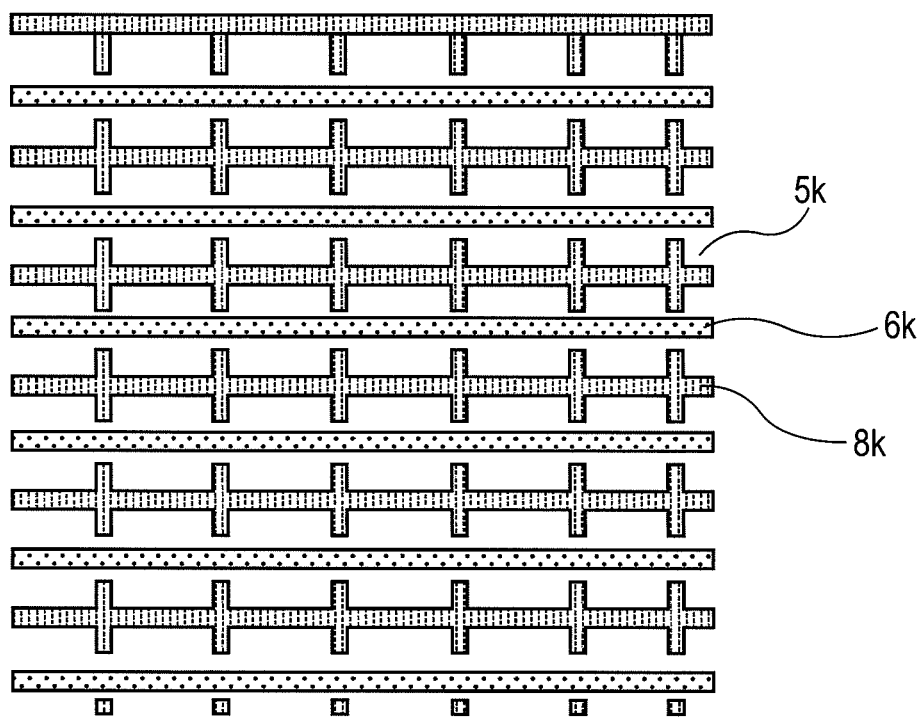
FIG. 25 shows an example of a cross sectional view for a main portion as viewed on the side of a source region over (0001) surface of a 4h-SiC semiconductor element of a fifth embodiment.

A fifth embodiment, different from the second, third, and fourth embodiments, a gate electrode 6h and a buried oxide film 8h each have a hollow tetragonal unit structure. In the fifth embodiment, the buried oxide film layer 8h having the tetragonal unit structure applies an isostatic compressive strain to the channel region. Different from the second, third, and fourth embodiment, since the fifth embodiment can be formed by fabrication only in two directions intersecting to each other at 90 degree, arrangement and fabrication of chip ends are facilitated. The tetragonal shape is preferably closer to a normal tetragonal shape so as to apply more isostatic strain. In FIG. 22, the buried oxide film layer 8h is not present inside the normal tetragonal shape, but the buried oxide film layer 8h may also be arranged inside the gate electrode 6h. In FIG. 22, the gate electrodes 6h inside of the respective hexagonal shapes are isolated from each other, all of respective gate electrodes 6h are electrically conducted, for example, by providing a metal layer thereover in the subsequent manufacturing step, so that a voltage can be applied by a gate electrode pad at one position. On the contrary, as shown in FIG. 23 and FIG. 24, each of the gate electrodes 6b may be connected directly without providing the interconnect layer thereover, so that the voltage may be applied by the gate electrode pad 11 at one position by the method as shown in FIGS. 17A and 17B of the second embodiment. For the connection method of the gate electrodes between each of the tetragonal unit structures, the unit structure may not be connected on every column in one direction as in FIG. 23 and FIG. 24 but may be connected to other columns or gate electrodes of elements in a different direction.

Sixth Embodiment

In a sixth embodiment, gate electrodes 6k and buried oxide film layers 8k are arranged alternately in a stripe shape and the buried oxide film layer 8k has a shape having a plurality of branched structures on both sides. In the sixth embodiment, since the branched structures 8k of the buried oxide film layer surround the channel region from four sides, an isostatic compressive strain can be applied on the channel region.

Further, in the sixth embodiment, the gate electrodes 6k are gathered at one end thereof and connected to a gate pad on a chip. Thus, in the sixth embodiment, change of process from the existent structure may be decreased compared with the second, third, fourth and fifth embodiments.

While surrounding structures have been shown in the preferred embodiments of the invention, it is not always necessary to surround the region continuously but, alternatively, buried oxide film layer may be present discretely in a state divided into the directions of two or more axes so long as the strain is applied so as to surround the channel.

Seventh Embodiment

Figures 26A, 26B:
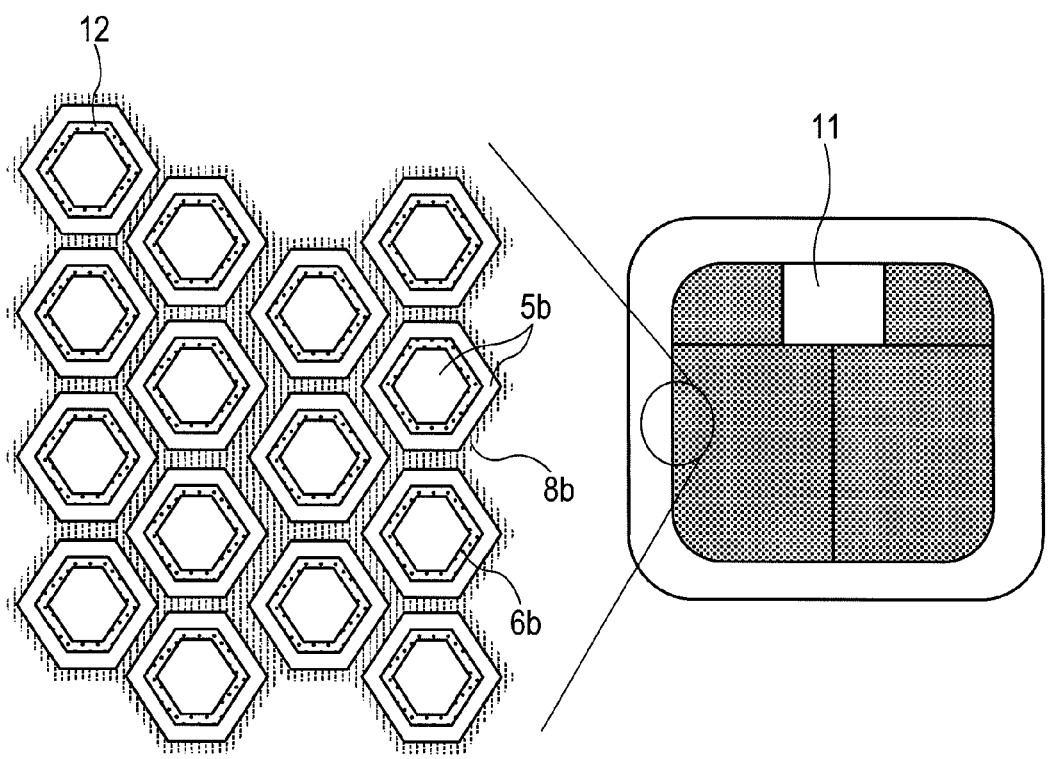
FIG. 26A is a view on the side of a source region over (0001) surface of a 4h-SiC semiconductor element of a sixth embodiment.
FIG. 26B is a fragmentary enlarged view thereof.

In a semiconductor device of a seventh embodiment as shown in the example of FIGS. 26A and 26B, one or plurality rows of simulated (dummy) gate electrodes 12 not electrically conducted to the gate pad 11 is arranged at the chip end of a semiconductor device. While transistors at the chip end include a portion not applied with effective strain from the buried oxide film layer, only the transistors applied with the effective strain can be operated to improve the withstanding voltage of the element by not conducting the transistors at the chip end. The structure of the surface where the source electrode and the gate electrode are present on the element (0001) surface of the element may be of the structure of any of first, second, third, fourth, fifth, and sixth embodiments.

What is claimed is:
1. A 4h-SiC semiconductor element comprising:
a 4h-SiC substrate;
a drift region having a c-axis in a direction perpendicular to the surface of the substrate and formed on the side of the surface of the substrate by using 4h-S C;
a base region formed on the side of the surface of the drift region using 4h-SiC;
a source region formed on the side of the surface of the base region by using 4h-SiC;
a source electrode formed on the side of a surface of the source region by using 4h-SiC;
a trench-shaped gate electrode covering the channel region of the base region;
a gate insulating film formed at the boundary between the gate electrode and the channel region;
a drain region formed on the side of a back of the 4h-SiC substrate by using 4h-SiC;
a drain electrode formed on the side of the back of the drain region; and
a trench-shaped buried oxide film layer of applying a compressive strain in a direction of two axes or more on a plane perpendicular to the c-axis of the channel region and applying a tensile strain along the direction of the c-axis.

2. The 4h-SiC semiconductor element according to claim 1, wherein the trench-shaped buried oxide film layer is formed to a depth identical with that of the trench-shaped gate electrode.

3. The 4h-SiC semiconductor element according to claim 1, wherein the trench-shaped buried oxide layer is formed to a depth shallower than the depth of the trench-shaped gate electrode.

4. The 4h-SiC semiconductor element according to claim 1, wherein the trench-shaped buried oxide film layer is formed to a depth deeper than the depth of the trench-shaped gate electrode.

5. The 4h-SiC semiconductor element according to claim 1, wherein the trench-shaped buried oxide film layer is formed so as to surround the periphery of the gate electrode on a plane perpendicular to the c-axis.

6. The 4h-SiC semiconductor element according to claim 5, wherein the trench-spaded buried oxide film layer has a hollow hexagonal, trigonal, circular, or tetragonal shape and is formed so as to surround the gate electrode.

7. The 4h-SiC semiconductor element according to claim 1, wherein the trench-shaped gate electrode has a hollow hexagonal, trigonal, circular, or tetragonal shape, and the trench-shaped buried oxide film layer is formed in the hollow layer of the gate electrode.

8. The 4h-SiC semiconductor device according to claim 7, wherein the trench-shaped buried oxide film layer has a hexagonal, trigonal, circular, or tetragonal shape.

9. The 4h-SiC semiconductor element according to claim 1,
wherein the trench-shaped buried oxide film layers and the gate electrodes are alternately formed in a stripe pattern, and
wherein each of the buried oxide film layers has a plurality of branched structures on both sides, and the plurality of branched structures have a shape surrounding the periphery of the gate electrode.

10. A semiconductor device in which semiconductor elements according to claim 1 are arranged,
wherein the device has a gate electrode pad and
wherein gate electrodes of a plurality of semiconductor elements are electrically conducted to the gate electrode pad by way of interconnects.

11. The 4h-SiC semiconductor element according to claim 1, wherein the trench-shaped buried oxide film layer is a thermal oxide film.

* * * * *